United States Patent [19]

Boston

[11] 4,223,087
[45] Sep. 16, 1980

[54] METHOD OF MAKING PLATE OLEOPHILIC

[75] Inventor: David R. Boston, Woodbury, Minn.

[73] Assignee: Minnesota Mining and Manufacturing Company, Saint Paul, Minn.

[21] Appl. No.: 694,480

[22] Filed: Jun. 9, 1976

Related U.S. Application Data

[63] Continuation of Ser. No. 531,712, Dec. 11, 1974, abandoned, and a continuation-in-part of Ser. No. 431,364, Jan. 7, 1974, abandoned.

[51] Int. Cl.$^2$ .................................................. G03F 7/02
[52] U.S. Cl. ..................................... 430/302; 101/465; 101/466; 101/467; 430/309; 430/401; 430/449
[58] Field of Search ..................... 96/29 L, 33, 48 R; 101/463, 465, 466, 467; 252/186

[56] References Cited

U.S. PATENT DOCUMENTS

| | | | |
|---|---|---|---|
| 3,083,097 | 3/1963 | Lassig et al. | 96/29 L |
| 3,721,559 | 3/1973 | De Haes et al. | 96/33 |
| 3,736,871 | 5/1973 | Blake | 96/33 |
| 3,832,175 | 8/1974 | Kemp | 96/29 L |

*Primary Examiner*—Edward C. Kimlin
*Attorney, Agent, or Firm*—Cruzan Alexander; Donald M. Sell; Gerald F. Chernivec

[57] ABSTRACT

A photolithographic plate, method for preparation thereof, and salt compound useful in the preparation, the method involving the treatment of a metallic silver image on a substrate with a homogeneously stable acidic aqueous salt solution comprising a ferricyanide anion for oxidizing the metallic silver and an organic cation capable of forming a water-insoluble, inherently oleophilic complex with oxidized silver, the cation being derived from a protonatable nitrogen-substituted hydrocarbon compound containing a formal imine group therein which is in resonant association with adjacent groups within the hydrocarbon compound.

5 Claims, 2 Drawing Figures

STAGE A

STAGE B

STAGE C

STAGE D

STAGE E

STAGE A

STAGE B

STAGE C

STAGE D

STAGE E

METHOD OF MAKING PLATE OLEOPHILIC

BACKGROUND OF THE INVENTION

This is a continuation of application Ser. No. 531,712 filed Dec. 11, 1974, now abandoned. This application is a continuation-in-part of Ser. No. 431,364, filed Jan. 7, 1974, now abandoned.

This invention relates to lithographic printing and, more particularly, to a photolithographic-image receptor sheet and to a method for rendering a metallic silver image inherently oleophilic.

In assignee's copending application Ser. No. 397,986, filed Sept. 21, 1964 in the name of Eikvar, and now abandoned, incorporated herein by reference, a sheet structure suitable for photolithographic printing is described. The sheet structure comprises a base sheet having an organophilic surface over which is coated a tough hydrophilic layer (e.g., silica). The hydrophilic layer is liquid permeable and contains a metal ion reduction promoter therein. In preferred structures a photographic emulsion is coated over the hydrophilic layer.

After light exposure of the photographic emulsion it is contacted with a liquid developer which, by means of a diffusion transfer process, causes transfer of unreduced metal ions (from non-image areas of the photographic emulsion) into the hydrophilic layer where such ions become reduced to the metallic state. The photographic emulsion is then removed, after which the hydrophilic layer is contacted with a bleaching solution which leaches out silver from such layer. The plate is then gently swabbed with rinsing to remove and clean away portions of the hydrophilic layer to reveal or expose the underlying organophilic surface in desired image areas. The resulting plate can then be placed on a press, inked, and run in a printing process.

Although the aforementioned sheet structure exhibits numerous advantages over previously provided structures, the image quality and press durability of the resulting printing plate depend upon opposing properties of the hydrophilic layer. Thus, for optimum ease of development and image quality the hydrophilic layer should be quite friable and easily removed in image areas to lay bare the underlying organophilic surface. On the other hand, long press life depends upon the hydrophilic layer being hard and durable. Because of these opposing properties, the hardness or toughness of the hydrophilic layer must be adjusted so as to attain the desired balance between image quality and press life. Also, the sheet structure ordinarily does not have a visible image after development which hinders proofing of the plate before inking.

In one aspect the present invention provides a method for processing a sheet structure such as described above in such a manner that a very durable printing plate is obtained having visible image areas and good image quality. Furthermore, using the method of this invention, the image quality of the resulting plate is not dependent upon the hardness of the hydrophilic layer.

Activators for treating metallic silver-imaged printing plates are of course known. For example, in U.S. Pat. No. 3,721,559, an activator solution containing an oxidizing agent and organic thiones, or mercapto tautomers thereof, are disclosed. Similarly, in British Pat. No. 1,292,029, an activator solution containing a $Cr^{6+}$ oxidizing compound with an organic complexing agent is disclosed. However, to my knowledge, nowhere is disclosed an activator solution of the composition described herein, which is capable of providing inherently oleophilic silver image areas without necessity of pretreatment of the image with adjuvant or lacquer solutions.

SUMMARY OF THE INVENTION

In accordance with the present invention there is provided a method for rendering inherently oleophilic a surface having metallic silver thereon, the method comprising contacting the metallic silver with a homogeneously stable acidic aqueous salt solution comprising a ferricyanide anion capable of oxidizing metallic silver and an organic cation capable of forming a water insoluble, inherently oleophilic complex with oxidized silver, the organic cation being derived from a protonatable nitrogen-substituted hydrocarbon compound containing an imine group therein which is in resonant association with adjacent groups within the hydrocarbon compound.

In another aspect there is provided a salt compound comprised of a ferricyanide anion and at least one protonated organic molecule as defined above, which when dissolved in water provides an activator solution useful in the above method.

Accordingly, the invention makes possible the preparation of lithographic printing plates having inherently oleophilic image areas by mere chemical treatment (as opposed to an involved mechanical treatment) of a surface bearing a metallic silver image, the resulting oleophilic image areas being clearly visible without inking or other further treatment.

DETAILED DESCRIPTION OF THE INVENTION

Figure 1:
FIG. 1 shows the various stages in the preparation and processing of one type of lithographic plate; Stage A shows a base to which a hydrophilic coating is adhered by means of an adhesion coat; Stage B is the structure of Stage A over which is coated a photographic emulsion; Stage C shows the structure after exposure thereof to light; Stage D shows the exposed structure after being contacted with a suitable developer; and Stage E is the final lithographic plate.
Figure 1:
Figure 1:
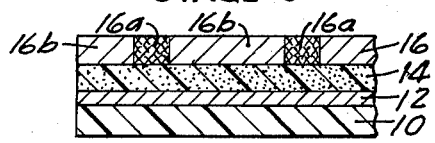
Figure 1:
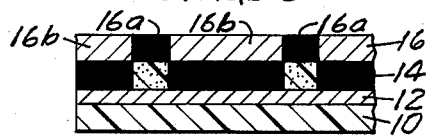
Figure 1:
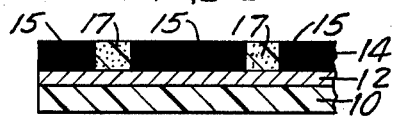

Stage A of FIG. 1 shows a base sheet 10 over which is coated layer 12 which serves as an adhesion coating between hydrophilic layer 14 and base sheet 10. Hydrophilic layer 14 is preferably tough and durable and need not be liquid permeable. It preferably comprises colloidal silica. Layer 14 also contains metal-ion reduction promoter.

In Stage B there is shown the structure of Stage A to which has been added a layer 16 of a high contrast photographic emulsion. The structure shown in Stage C is that of Stage B after light exposure thereof to an image. In light exposed areas the silver compound in emulsion layer 16 is converted into a latent reduced state, in areas 16a, while remaining unexposed and still light-sensitive in areas 16b.

In Stage D there is shown the structure of Stage C after it has been contacted with a developer solution. The silver compound in the light struck areas 16a is thereby reduced to the metallic state, having a visible black color. The soluble silver halide previously present in the areas 16b has transferred or diffused along with the developing solution into the layer 14 and into contact with the metal ion reduction promoter thereat where the silver is reduced to the metallic state. Actually, the reduction of the silver at layer 14 ordinarily takes place a few seconds later than in the light-exposed areas of the emulsion layer 16a, so that, as the plate is developed an image (which is negative with respect to the original) will first appear in black in areas 16a, following which the entire viewable surface of the plate will appear black as the silver is reduced to the metallic state at layer 14.

In Stage E there is shown the plate after removal of the emulsion layer. Surfaces 15 of the plate comprise metallic silver which must be treated in accordance with this invention to render them oleophilic (i.e., ink-receptive). This result is attained by contacting surfaces 15 (or the entire surface of the structure) with a homogeneously stable acidic aqueous salt solution, comprising a ferricyanide anion capable of oxidizing metallic silver and an organic cation complexing agent, hereinafter defined, capable of forming a water-insoluble, oleophilic complex with oxidized silver. By homogeneously stable is meant the ferricyanide anion and the organic cation complexing agent are substantially non-reactive towards each other. Background areas 17 remain hydrophilic.

Figure 2:
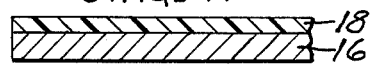
FIG. 2 shows the various stages in another manner of preparing and processing a lithographic plate; wherein Stage A shows a carrier to which a photographic emulsion is applied; Stage B is the structure of Stage A after light exposure; Stage C is the structure of Stage B after being contacted with a developer and subsequently placed against a hydrophilic layer carried on a base; Stage D shows the structure of Stage C after diffusion of the developer into the hydrophilic layer; and Stage E is the final lithographic plate.
Figure 2:
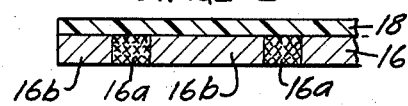
Figure 2:
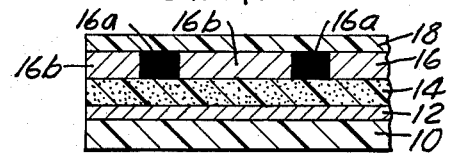
Figure 2:
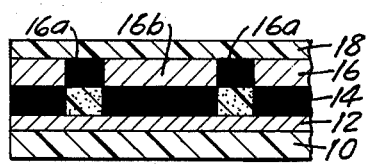
Figure 2:
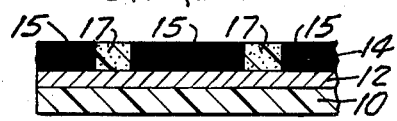

FIG. 2 shows an alternative manner of preparing a lithographic plate. Stage A shows a carrier sheet 18 carrying an emulsion layer 16. Stage B shows the structure of Stage A after light exposure thereof to an image. The structure of Stage B is then contacted with a developer solution to saturate layer 16.

While layer 16 is saturated with developer a composite structure is formed as shown in Stage C, where layer 16 is positioned against hydrophilic layer 14. Layer 14 contains a metal-ion reduction promoter.

In Stage D there is shown the structure of Stage C after the soluble silver halide from layer 16 has transferred or diffused along with the developer solution into layer 14 and into contact with the metal ion reduction promoter thereat where the silver is reduced to the metallic state.

In Stage E there is shown the plate after removal of the emulsion layer. Surfaces 15 of the plate comprise metallic silver which are rendered oleophilic by contacting them with the homogeneously stable activator solution.

The oxidizing agent useful herein is an alkali metal ferricyanide which is soluble in water, e.g., potassium ferricyanide, the formula of which is $K_3[Fe(CN)_6]$. While alkali metal dichromates are useful as oxidizing agents in the activator solution, an inherently oleophilic silver image area is not produced. By inherently oleophilic is meant the silver image areas will accept ink without necessity of pretreatment thereof with an adjuvant solution, lacquer, etc.

The organic cation complexing agent is derived from a protonatable nitrogen-substituted hydrocarbon compound containing a formal imine group therein, i.e., a $C=N$ group, wherein the imine group is in resonant association with adjacent groups within the compound.

By resonant association is meant that the formal imine group, together with adjacent groups within the molecule, display the phenomenon known as resonance. This phenomenon means that the electronic structure of the molecule can be depicted in two or more ways while the atom positions remain unchanged. In this instance, the actual electronic state of the molecule has greater stability, i.e., greater negative potential energy, than any of the individual structures. See Glasstone, *Textbook of Physical Chemistry*, Van Nostrand Co., Inc., New York, New York (1940), at pp. 110–111.

In a structural sense, for resonance to occur the imine group within the hydrocarbon compound must be in conjugation with a $C=C$ group or another imine group, or is bonded to a nitrogen atom. This can be graphically represented by the structural notation:

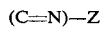

(C=N)—Z wherein Z represents $C=N$, $C=C$, or N, and wherein Z can be attached to either the carbon atom or the nitrogen atom of the imine group.

Resonance stabilizes the imine functional group and thereby provides a high degree of oleophilicity to the complexed silver image surfaces.

Examples of nitrogen-substituted hydrocarbon compounds include cyclic and acyclic amidines, i.e., compounds having the formal chemical grouping:

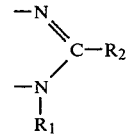

wherein $R_1$ and $R_2$ may be hydrogen, hydrocarbons, or nitrogen-substituted hydrocarbons in any of the classes, alkyl, aryl, or aralkyl, and where cyclic or ring-structured amidines are completed by hydrocarbon groups to provide 5- or 6-membered ring structures. Exemplary acyclic amidines include acetamidine, benzamidine, guanidine and biguanide. Typical cyclic amidines include 2-propyl-2-imidazoline, 2-pentyl-2-imidazoline, 2-benzyl-2-imidazoline and naphthazoline.

Further examples of suitable complexing agents include aromatic nitrogen-substituted heterocyclic aromatic compounds, such as 5- and 6- membered cyclic or bicyclic compounds containing one or more nitrogen atoms therein, including mono-substituted or poly-substituted hydrocarbon or nitrogen functional hydrocarbon derivatives thereof. Exemplary aromatic heterocyclic compounds include 2-methylimidazole, 1-benzylimidazole, 1-butylimidazole, 2-undecylimidazole, 2,2'-dipyridylamine, 2,4-lutidine, pyridine, and N-aminopyridine. Bicyclic compounds include benzimidazole, 2-methylbenzimidazole, 1-ethyl-2-methylbenzimidazole.

The aromatic nitrogen heterocyclic compounds should all contain at least one nitrogen atom in the parent ring structure which is sterically unhindered, so as to be capable of coordination to a silver ion, i.e., capable of forming a chemical bond therewith.

The activator solutions useful herein can be prepared by simply mixing in water an alkali metal ferricyanide salt, e.g., potassium ferricyanide, the organic nitrogen compound, and a concentrated acid of sufficient quantity to protonate the organic nitrogen compound, e.g., HCl. Alternatively, instead of utilizing an acid, a hydrohalide salt of the organic compound may be utilized. To insure proper oxidation of the metallic silver, at least about 0.01 moles of the ferricyanide salt should be utilized per liter of solution.

It has been determined that the cationic derivatives of the organic nitrogen complexing compounds and the ferricyanide anion, i.e., $[Fe(CN)_6]^{-3}$, represent the least soluble ion pair or salt when mixed in water as described above. By evaporation of water from the solution, or other similar technique to affect solubility, crystals of the salt formed from this least soluble ion pair will appear and can be effectively separated from the solution. This novel ferricyanide salt of the protonated organic nitrogen complexing compound can subsequently be conveniently redissolved in water to provide an activator solution for rendering metallic silver surfaces inherently oleophilic.

The salt formed between the cationic derivatives of the above-defined organic constituent and the ferricyanide anion must have a solubility in water greater than about 0.01 moles per liter to provide sufficient ferricyanide anion to effectively oxidize the metallic silver, The invention is more fully illustrated by means of the following examples.

EXAMPLE 1

A support sheet composed of 4 mil (100 microns) polyethylene terephthalate film is coated on one surface with an 8 micron thick (dry) organophilic layer, the organophilic layer being applied from a solution containing 48 percent solids by weight of vinyl chloride-acetate resin ("Vinylite VAGH", commercially available from Union Carbide) and titanium dioxide pigment ("Unitane OR350", commercially available from American Cyanamid) in a ratio of 3 parts titanium dioxide to 1 part by weight vinyl chloride-acetate resin. The pigment is dispersed in the resin solution of methyl ethyl ketone before coating by ball milling for 48 hours. After coating the resulting solution on the support sheet it is dried at 150° F. for 5 minutes.

The so-coated support sheet is then overcoated with a hydrophilic layer whose formulation is set forth below, followed by drying for 20 seconds at 150° F.

| Ingredient | Amount |
| --- | --- |
| "Nalco 1030" colloidal silica (30% solids; commercially available from Nalco Chemical Company) | 800 grams |
| Water | 696 grams |
| Glycerine | 15 grams |
| "Silver Protein Mild" (at 10% solids in water; commercially available from Merck and Co., Inc.) | 8 milliliters |

A high contrast chlorobromide photographic emulsion (e.g., having a chloride/bromide ratio of 2:1 and a gelatin/silver ratio of 1.2:1) is then coated over the hydrophilic layer at a silver coating weight of 20 milligrams per square decimeter.

A 10"×16" sheet of the above material is placed on the vacuum back of a Robertson 320 process camera fitted with an image reversal lens. The plate is then exposed to a right reading, positive, line copy original at a 32 f stop for 12 seconds. The exposed plate is then immersed for 30 seconds at 72° F. in a tray of diffusion transfer developer with the following composition:

| Ingredient | Amount |
| --- | --- |
| deionized water | 1000 milliliters |
| sodium sulfite | 80 grams |
| hydroquinone | 35 grams |
| sodium thiosulfate | 15 grams |
| sodium hydroxide | 28.5 grams |
| potassium bromide | 2.5 grams |
| 0.5% benzotriazole in water | 25 milliliters |

This diffusion transfer developer differs from a conventional photographic developer by the addition of sodium thiosulfate which acts as a diffusion transfer agent, dissolving and forming a complex with silver halide, but not with silver in either its light-reducued or developer-reduced form. Following immersion in the developer a silver negative image appears in the light struck areas, and shortly thereafter a silver positive image is formed in the hydrophilic layer. The emulsion layer is then removed by running tap water at a temperature of about 110° C. over the plate for about 20 seconds to lay bare the underlying hydrophilic surface containing the positive silver image (i.e., metallic silver), at least a portion of the metallic silver residing on the surface of the hydrophilic layer.

The plate is then immersed for 25 seconds, at room temperature, in a homogeneously stable activator solution comprising the following ingredients:

| | Amount |
| --- | --- |
| Potassium ferricyanide | 33.0 grams |
| Sodium chloride | 17.5 grams |
| 2-Benzyl-2-imidazoline hydrochloride | 10.0 grams |
| Deionized water (in amount sufficient to make one liter of solution) | |

The plate is then washed with water for five seconds and dried. The clearly visible, positive image areas are ink-receptive and background areas remain hydrophilic. To improve the ink/water balance even further, the plate may, if desired, be rubbed with a 0.5% solution of sodium oleate in water. The plate is clamped onto a lithographic printing press and used to produce thousands of good quality copies.

The above homogeneously stable solution remains substantially stable (i.e., active and homogeneous) indefinitely. Some scumming of the solution may be noticed upon long standing, but this has no effect on the ability of the solution to render the metallic silver surfaces inherently oleophilic. A five-gallon quantity of this solution is sufficient to process more than 15,000 plates of the type described in this example.

Sodium chloride was added to the activator solution in the preceding example to aid in the oxidation of the metallic silver. Other alkali metal/halide salts may be utilized for the same purpose. Additional materials may be added as desired to effectuate a particular purpose as long as the component is not reactive with either the cationic organic complexing agent or the ferricyanide anion.

EXAMPLE 2

A solution similar to the activator solution of Example 1 was prepared by first dissolving 6.60 grams (0.02 moles) potassium ferricyanide in 200 milliliters of water.

To this solution was added 7.88 grams (0.04 moles) of 2-benzyl-2-imidazoline hydrochloride and the resulting mixture warmed until solution was complete. The solution was cooled at 0° C. overnight, resulting in yellow crystals separating from the solution.

The crystals were collected and twice recrystallized by dissolving them in a small amount of 50° C. water followed by cooling. The twice-recrystallized salt was dried in vacuo over phosphorus pentoxide.

The resultant ferricyanide salt, by elemental analysis, was calculated to contain 62.1 percent by weight carbon, 5.6 percent by weight hydrogen, 24.5 percent nitrogen, and 8.1 percent iron. Assuming the salt to be formed from the protonated imidazoline compound and ferricyanide, its simplified formula would be $C_{36}H_{39}N_{12}Fe$. Calculation of theoretical weight percentages provides 62.1 percent carbon, 5.6 percent hydrogen, 24.3 percent nitrogen, and 8.0 percent iron, which coincide with the actual percentages obtained by elemental analysis.

As further proof of the composition of the salt, 1.39 grams (0.002 moles) of the yellow crystals were dissolved in 50 milliliters of water, following which 0.45 grams (0.006 moles) of potassium chloride was added.

To this solution was added 500 milliliters of absolute ethyl alcohol to effectuate metathesis of the ion pairs, i.e., to change the solubility characteristics between the ion pairs such that the least soluble ion pair is no longer the ferricyanide anion and the organic nitrogen-substituted hydrocarbon cation. A yellow precipitate was formed, which was analyzed to be almost pure potassium ferricyanide.

When a plate having metallic silver image areas formed as per Example 1 is treated with an aqueous solution of the ferricyanide salt of the protonated imidazoline compound, formed by simply dissolving the salt in water, the silver image areas are rendered inherently oleophilic, and the plate is capable of producing thousands of excellent copies.

EXAMPLES 3–15

Separate activator solutions are prepared by mixing 0.06 moles of concentrated hydrochloric acid, 0.03 moles of potassium ferricyanide, and 0.06 moles of organic nitrogen compound in 500 milliliters of water, following which sufficient water is added to make 1.0 liter of solution. The organic nitrogen compounds utilized are: acetamidine, 2-propyl-2-imidazoline, 2-pentyl-2-imidazoline, guanidine, biguanide, 1-benzylimidazole, 2 methylbenzimidazole, 1-ethyl-2-methylbenzimidazole, pyridine, 2,4-lutidine, N-aminopyridine, and 2,2′-dipyridalamine.

When each of these activator solutions are substituted for that of Example 1, inherently oleophilic silver image areas result, producing a lithographic printing plate.

EXAMPLE 16

A solution was prepared by dissolving 4.12 grams (0.0125 moles) of potassium ferricyanide in 50 milliliters of water. To this solution were added 2.05 milliliters of concentrated hydrochloric acid and 3.61 grams (0.025 moles) of 4-phenylimidazole. An immediate precipitate was formed, collected, and dried under vacuum over phosphorus pentoxide. Elemental analysis compared to theoretical calculations clearly indicate the compound to be the ferricyanide salt of the protonated imidazole.

The salt was placed in 10 milliliters of water and stirred, whereby a saturated solution was formed and used to treat a plate imaged with metallic silver as per Example 1, whereupon a printing plate possessing oleophilic silver image areas was prepared.

EXAMPLE 17

A solution was prepared by dissolving 16.50 grams (0.05 moles) of potassium ferricyanide in 200 milliliters of water. To this solution were added 8.26 milliliters of concentrated hydrochloric acid and 16.02 grams (0.10 moles) of 1-ethyl-2-methyl benzamidazole. A yellow precipitate was immediately formed which was collected. The precipitate was redissolved in 250 milliliters of warm water (50° C.) and allowed to cool to room temperature, whereupon the yellow precipitate reappeared. The yellow crystals were collected and dried in air, and when an elemental analysis was compared with theoretical calculations, the solid was clearly indicated to be a ferricyanide salt of the protonated imidazole. A saturated solution was prepared by placing the salt in 10 milliliters of water with stirring, and the solution utilized to treat the silver imaged printing plate formed as per Example 1, whereupon results similar to Example 16 were obtained.

EXAMPLE 18

A solution was prepared by dissolving 9.90 grams (0.03 moles) of potassium ferricyanide in 1 liter of water. To this solution were added 4.96 milliliters of concentrated hydrochloric acid and 7.08 grams (0.06 moles) of benzimidazole. After allowing to stand for approximately one day at room temperature, yellow crystals were apparent in the solution. These crystals were collected and dried in air. An elemental analysis when compared with theoretical calculations clearly indicated the crystals to be the ferricyanide salt of the protonated imidazole.

A saturated solution, prepared by mixing the salt in 10 milliliters of water provided an excellent activator solution for the metallic silver imaged plate formed as per Example 1.

EXAMPLE 19

A solution was prepared by adding 3.30 grams (0.01 moles) of potassium ferricyanide to 150 milliliters of water. To this solution were added 1.65 milliliters of concentrated hydrochloric acid and 4.48 grams (0.02 moles) of 2-undecyl-2-imidazoline, the latter being added slowly with vigorous stirring of the solution. A yellow precipitate was immediately formed, collected, and dried. Elemental analysis of the solid when compared with theoretical calculations clearly indicated it to be a ferricyanide salt of the protonated imidazoline.

A saturated solution, prepared by mixing the salt in 10 milliliters of water provided an excellent activator solution capable of rendering metallic silver-imaged plates inherently oleophilic in image areas.

EXAMPLE 20

A solution was prepared by dissolving 2.5 grams (0.0075 moles) of potassium ferricyanide in 15 milliliters of water. To this solution were added 15 milliliters of an aqueous solution containing 2.11 grams (0.015 moles) of 2-phenyl-2-imidazoline and 0.55 milliliters of concentrated hydrochloric acid. A yellow precipitate was formed immediately. The solid was collected and dried, and an elemental analysis compared to theoretical calculations clearly indicated the crystals to be the ferricyanide salt of the protonated imidazoline.

A saturated solution, prepared by mixing the salt in 10 milliliters of water, provided an excellent activator solution as per the preceding examples.

EXAMPLE 21

A solution was prepared by dissolving 16.5 grams (0.05 moles) of potassium ferricyanide in 100 milliliters of water. To this solution were added 16.42 grams (0.20 moles) of 2-methylimidazole and 16.5 milliliters of concentrated hydrochloric acid. The solution was reduced in volume without heat until a substantial amount of solid appeared in the bottom of the flask. Upon collection of the solid, white crystals and yellow crystals were evident. The solid material was stirred in methanol whereupon the yellow solid dissolved. The yellow solution was then separated by decanting and reduced in volume until yellow crystals appeared. The crystals were collected and dried, and an elemental analysis, when compared to theoretical calculations, indicated the material to be the ferricyanide salt of the protonated imidazole.

A saturated solution, prepared by mixing the salt in 10 milliliters of water, provided an excellent activator solution for rendering silver metallic surfaces inherently oleophilic.

EXAMPLE 22

A solution was prepared by dissolving 8.25 grams (0.025 moles) of potassium ferricyanide in 50 milliliters of water. To this solution were added 4.13 milliliters of concentrated hydrochloric acid and 7.61 grams (0.05 moles) of 1-benzyl imidazole. The solution was cooled for 15 minutes in cold water, whereupon a precipitate was formed. The solid was collected and dried, and an elemental analysis when compared with theoretical calculations indicated the material to be the ferricyanide salt of the protonated imidazole.

A saturated solution, prepared by mixing the salt in 10 milliliters of water, provided an excellent activator solution for rendering metallic silver image areas inherently oleophilic.

In some of the preceding examples it may be noted that a precipitate of the novel ferricyanide salt compound occurred almost immediately. This is of course due to the fact that an excess of component quantities were added to deliberately exceed the solubility limits of the salt in the solution. The same results could have been achieved by other techniques to reduce the solubility of the salt, e.g., chilling the solution or removing a portion of the water.

In some instances, it has been determined that the solubility characteristics of the ion pairs in solution are such that the salt formed contains a cationic portion comprised of one ion of potassium and two ions from the protonated organic material as opposed to the previous examples, wherein the cationic portion was comprised of three ions from the protonated organic material.

EXAMPLE 23

A solution was prepared by mixing 3.30 grams (0.01 moles) of potassium ferricyanide in 150 milliliters of water. To this solution were added 0.83 milliliters of concentrated hydrochloric acid and 4.94 grams (0.02 moles) of naphthazoline hydrochloride, the latter slowly with vigorous stirring. Immediately, yellow-green solid was obtained. The solid was collected and placed in 300 milliliters of water and heated to approximately 70° C. Part of the solid dissolved, whereupon the solution was separated from the solid and allowed to cool to room temperature. Upon cooling, greenish crystals appeared, which were collected and dried. Elemental analysis, when compared with theoretical calculations, indicated the crystals to be a ferricyanide salt wherein the cationic portion was comprised of one ion of potassium and two ions of the protonated naphthazoline.

A saturated solution, prepared by mixing the salt in 10 milliliters of water, provided an excellent activator as per the preceding examples.

EXAMPLE 24

A solution was prepared by dissolving 8.6 grams (0.026 moles) of potassium ferricyanide in 20 milliliters of water. To this solution were added 5.0 grams (0.053 moles) of acetamidine hydrochloride in small portions while the solution was warmed. At the same time, small portions of water, approximately 2 milliliters each, were added until total solution was achieved. Water was removed from the solution by rotatory evaporation until orange crystals appeared. Upon collection and drying of the crystals, elemental analysis, when compared with theoretical calculations, indicated the material to be a ferricyanide salt wherein the cationic portion was derived from two ions of the acetamidine and one ion of potassium.

A saturated solution, prepared by mixing the salt in 10 milliliters of water, provided an excellent activator as per the preceding examples.

What is claimed is:

1. A method for rendering oleophilic a surface having metallic silver in an imagewise pattern thereon comprising contacting said metallic silver with a homogeneously stable acidic aqueous salt solution comprising a ferricyanide anion and an organic cation complexing agent capable of forming a water-insoluble, oleophilic complex with oxidized silver, said cation comprising a protonated nitrogen-substituted hydrocarbon compound containing a formal imine group therein, said imine group being in resonant association with adjacent groups within said hydrocarbon compound.

2. The method of claim 1 wherein said nitrogen-substituted hydrocarbon compound is an amidine compound.

3. The method of claim 2 wherein said amidine compound is 2-benzyl-2-imidazoline.

4. The method of claim 1 wherein said solution further comprises an alkali metal cation and a chloride anion.

5. A substrate having a surface comprising image areas and background areas, said image areas comprising silver which has been rendered inherently oleophilic by the method of claim 1, and said background areas being hydrophilic.

* * * * *